United States Patent [19]
Shoji et al.

[11] Patent Number: 6,046,070
[45] Date of Patent: Apr. 4, 2000

[54] METHOD OF POST-PROCESSING SOLID-STATE IMAGING DEVICE

[75] Inventors: Hiroo Shoji, Tokyo; Takayuki Iizuka, Kanagawa, both of Japan

[73] Assignee: Sony Corporation, Tokyo, Japan

[21] Appl. No.: 08/745,664

[22] Filed: Nov. 8, 1996

[30] Foreign Application Priority Data

Nov. 10, 1995 [JP] Japan ..................... 7-292525

[51] Int. Cl.[7] ............................ H01L 21/00
[52] U.S. Cl. ............... 438/66; 438/64; 438/67; 438/68; 257/724; 250/208.1
[58] Field of Search ................ 438/64, 66, 67, 438/68; 257/724; 250/208.1, 238

[56] References Cited

U.S. PATENT DOCUMENTS

| 4,406,825 | 9/1983 | Pez et al. ............... 252/500 |
| 4,745,470 | 5/1988 | Yabe et al. ............... 358/98 |
| 4,895,291 | 1/1990 | Ozimek et al. ............ 228/121 |
| 4,987,477 | 1/1991 | Ikeno ..................... 357/75 |
| 5,334,829 | 8/1994 | Ueno et al. ............. 250/208.1 |

FOREIGN PATENT DOCUMENTS 360007142  1/1985  Japan .

Primary Examiner—Joni Chang
Assistant Examiner—Long Pham
Attorney, Agent, or Firm—Hill & Simpson

[57] ABSTRACT

A method of post-processing a solid-state imaging device including a wafer processing step 1 (S1), an assembly step 2 (S2) in which packaging is performed, an inspection step 3 (S3), and an annealing step (S4) in which a solid-state having gone through the inspection step 3 is annealed at a predetermined temperature. The method makes it possible to reduce the level of an image defect that occurs after assembly.

10 Claims, 3 Drawing Sheets

METHOD OF POST-PROCESSING SOLID-STATE IMAGING DEVICE

BACKGROUND OF THE INVENTION

1. Field of the Invention

The present invention relates to a method of post-processing a solid-state imaging device which makes it possible to reduce the level of an image defect occurring in the solid-state imaging device after assembly.

2. Description of the Related Art

In general, in manufacturing solid-state imaging devices, the following steps are performed: a wafer manufacturing step, a wafer processing step, and an assembly step in which packaging is performed. Upon completion of the assembly, the solid-state imaging devices are inspected, and only those which have past the inspection test are shipped.

An image defect may occur as a result of static electricity, electrical noise, or the like, in some of the solid-state imaging devices manufactured in the above-described way, which have past the inspection test performed after the assembly step.

Since, conventionally, there has been no effective way to prevent the occurrence of image defects in the imaging device after assembly, imaging devices in which image defects were detected, had to be thrown away.

SUMMARY OF THE INVENTION

Accordingly, a primary of the present invention is to provide a method of post-processing a solid-state imaging device which makes it possible to reduce the level of image defect occurring in an imaging device after assembly.

To this end, according to the invention, there is provided a method of post-processing a solid-state imaging device in which the imaging device is annealed at a predetermined temperature upon completion of the assembly.

In the above-described method of post-processing a solid-state imaging device, the solid-state imaging device is annealed at a predetermined temperature after assembly in order to reduce the level of lattice (point) defect in a solid-state imaging element (silicon chip, etc.), and thereby reduce the level of the image defect.

Although not exclusive, the method may include a first heating step in which the solid-state imaging device is heated, while preventing sudden vaporization of moisture absorbed by the solid-state imaging device, and a second heating step in which the solid-state imaging device is heated at a higher temperature than in the first heating step.

In this method, the moisture absorbed by the solid-state imaging device after a long period of storage is heated and removed in the first heating step. In the second heating step, the imaging device is heated at a higher temperature than in the first heating step in order to prevent synergistic effects between the heat and the moisture from occurring, as a result of which the image defect alone is effectively reduced.

DESCRIPTION OF THE PREFERRED EMBODIMENT

A description will now be given of the preferred embodiment of the present invention, with reference to the drawings.

Figure 1:
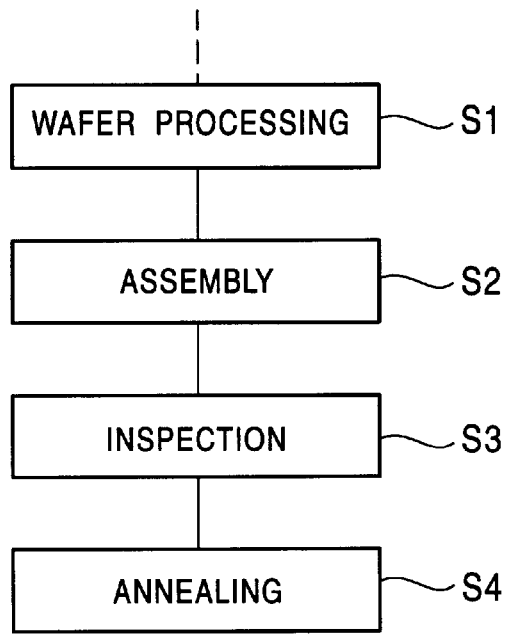
FIG. 1 is a flowchart illustrating the steps for manufacturing a solid-state imaging device in an embodiment of the present invention.

FIG. 1 is et flowchart illustrating the steps for manufacturing a solid-state imaging device in an embodiment of the present invention. Referring to FIG. 1, after manufacturing a wafer, the wafer is processed in Step 1 (S1) in order to form various thin films thereon, whereby a plurality of solid-state imaging elements are formed on the wafer.

Next, in assembly step 2 (S2), dicing and bonding are performed, followed by packaging in which sealing is performed.

Figure 2:
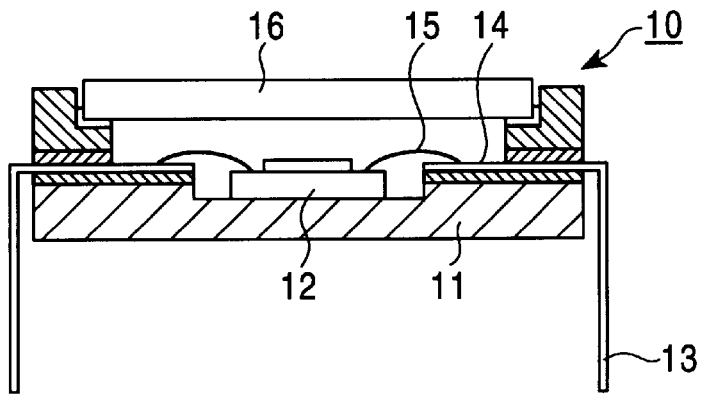
FIG. 2 is a sectional side elevational view of a ceramic package type solid-state imaging device.

FIG. 2 is a sectional side elevational view of a construction of a solid-state imaging device after assembly.

In the solid-state imaging device 10 of FIG. 2, a solid-state imaging element (chip) 12 is bonded, using a die bond, to the bottom of a recess in a package body 11 with a ceramic base. Through a wire 15, such as that made of gold, the solid-state imaging element (chip) 12 is electrically connected to an internal lead 14 integrally formed with an external lead 13 which extends out from both sides of the package body 11. A seal glass 16 is affixed with an adhesive (seal resin) to the upper ends of the package body 11, whereby the solid-state imaging element (chip) 12 in the recess is airtightly sealed.

Then, after assembly, the characteristics of the solid-state imaging device is inspected in Step 3 (S3), using a testing device.

Conventionally, the manufacturing of an solid-state imaging device is completed upon completion of the inspection step 3 (S3). In the present embodiment, there is an additional step, or the annealing step (S4) which follows the inspection step (S3). When an image defect is detected in a solid-state imaging device in the inspection step (S3), the device in which an image defect has been detected is annealed in the annealing step (S4) in order to reduce the image defect level.

In the annealing step 4 (S4), the higher the annealing temperature to which the solid-state imaging device is subjected, the lower the lattice (point) defect level in the solid-state imaging element, so that the image defect resulting from the lattice defect is more effectively reduced in level. However, when the temperature is too high, the structural parts of the solid-state imaging device are thermally damaged. Taking into account the low thermal resistance of an on-chip lens formed on the solid-state imaging element (chip) 12, the upper annealing temperature limit is about 150° C., even for a relatively long annealing time of, for example, about three hours, while the annealing temperature limit is about 180° C. for a relatively short annealing time of about 30 minutes. Therefore, in actually carrying out the present invention, the solid-state imaging device in which an image defect has been detected is placed in dry gas or under reduced pressure at a temperature of 125° C. and for 24 hours, in order to compare the levels of image defect before and after the annealing.

The comparison showed that the image defect level after annealing was reduced by about 50% of the image defect level before the annealing, which demonstrated that annealing performed after assembly considerably reduced the image defect level.

In the annealing step 4 (S4), either oven curing or column curing can be used as the heating method, as long as the actual annealing is performed in dry gas (or under reduced pressure).

After assembly, all of the solid-state imaging devices can be annealed, regardless of their image defect level. In addition, the image defect level of the imaging devices can be checked before shipment so that those imaging devices in which image defects have been detected can be annealed.

In recent years, mold packaging is replacing ceramic packaging as a method for packaging the solid-state imaging device. The main reasons for this are: (1) mold packaging allows assembly with higher precision (degree of flatness), (2) ceramic packaging involves the use of low-melting glass containing harmful substances, such as zinc, and (3) mold packaging is less costly.

Figure 3:
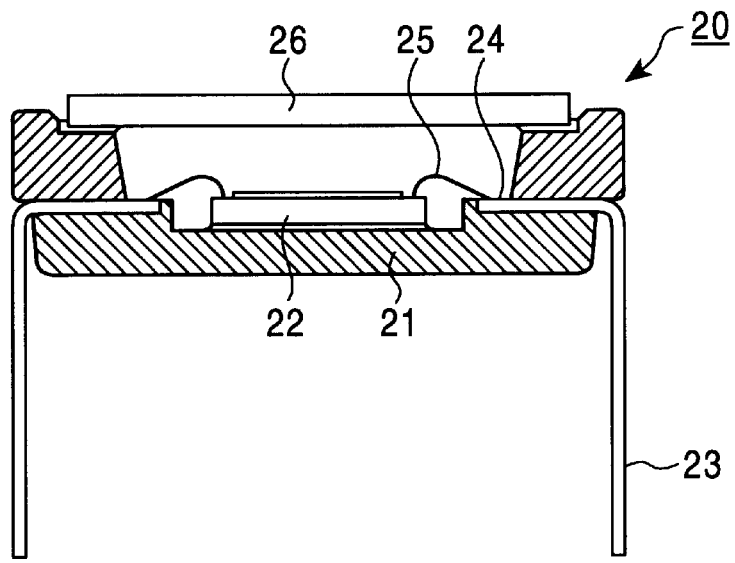
FIG. 3 is a sectional side elevational view of a mold package type solid-state imaging device.

FIG. 3 is a sectional side elevational view of a construction of the mold-packaging type solid-state imaging device. Referring to FIG. 3, in the solid-state imaging device 20, a mold resin is used for the package body 21 serving as the base. A solid-state imaging element 22 is bonded with a die bond to the bottom of a recess of the package body 21. The other component parts (external lead 23, internal lead 22, wire 25, seal glass 26, etc.) of the pickup device 20 are essentially the same as those of the ceramic-packaging type imaging device, so that a description thereof will not be given.

The only type of mold resin actually used in packaging is the thermosetting epoxy resin (including modifications thereof). Compared to thermoplastic resins, ceramics, and aluminum, the epoxy resin absorbs a relatively large amount of moisture to become saturated and, in addition, allows moisture to easily penetrate therethrough, so that a package made thereof, being stored, inevitably absorbs a large amount of moisture. It is a well known fact that a larger amount of moisture penetrates through the mold resin bulk compared to the amount of moisture that penetrates through the interface between the mold resin and the lead, the interface between the seal glass and the resin used for affixing the seal glass, and the interface between the seal resin and the mold resin. For this reason, a packaging technique has been proposed in which a metal island of the lead frame is made larger such that it functions as a plate impervious to moisture.

Even when such a packaging technique is used, however, the resin by nature absorbs a large amount of moisture in order to be saturated, so that after it has been left in an ordinarily humid environment for a long time, moisture remains absorbed in the package.

When such a solid-state imaging device in which moisture remains absorbed after long periods of storage is annealed at a temperature of about 125° C., the vaporization of the moisture absorbed in the package vaporizes without stopping, so that the moisture turns into vapor. In such a case, when a color filter is formed on the solid-state imaging element and annealing is performed, the heat produced by the annealing and the vapor act synergistically, causing the die in the color filter to fade, thereby deteriorating the color filter itself.

In order to overcome such a problem, in the present embodiment, annealing carried out to reduce the image defect level is performed by heating the imaging device in two steps, namely a first heating step and a second heating step. This makes it possible not only to prevent the color filter from fading in the mold-package type imaging device, but also to prevent the color filter from fading in the ceramic-package type imaging device, which may occur when the package absorbs moisture as it penetrates through the interface between the resin for affixing the seal glass and the glass.

In the first heating step, the solid-state imaging device is heated in dry gas or under reduced pressure, while preventing sudden vaporization of the moisture absorbed by the solid-state imaging device, whereby moisture absorbed by the solid-state imaging device after long storage is removed. Although the heating conditions depend on the amount of moisture absorbed by the solid-state imaging device, heating is, for example, performed at a temperature of about 85° C. for 1 to 72 hours.

When the solid-state imaging device is heated in the first heating step under reduced pressure, the package will not break, except when the heating is performed in an extremely high vacuum, since the package itself is firmly sealed with the seal glass and the thermosetting resin. In addition, the moisture is more effectively removed, when the heating is performed under reduced pressure than in dry gas.

In the second heating step which is essentially performed to reduce the image defect level, the solid-state imaging device is heated at a higher temperature than in the first heating step, such as at a temperature of about 125° C., and in dry gas or under reduced pressure. Here, the moisture absorbed by the imaging device after a long period of storage has been sufficiently removed in the first heating step, so that even when the solid-state imaging device is heated at a temperature level that will reduce the image defect level, vaporization of the moisture will virtually not occur. Consequently, deterioration of a color filter due to synergistic actions of the heat and moisture will not occur, whereby the image defect level alone is effectively reduced.

Figure 4:
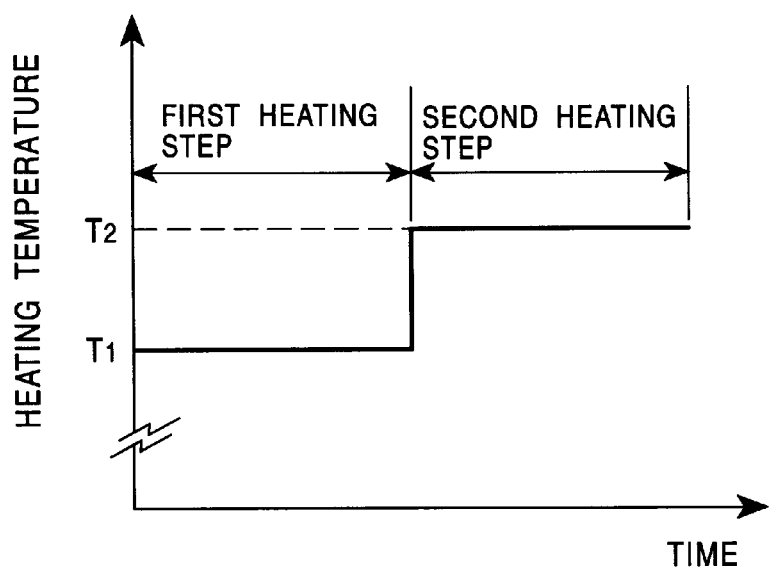
FIG. 4 is a profile showing the temperatures during annealing.

FIG. 4 is a profile of the actual temperatures during annealing. As can be understood from the figure, the first heating step was performed at a temperature $T_1$ of 85° C., for 24 hours, and in dry gas. The second heating step performed after the first heating step was performed at a temperature $T_2$ of 125° C., for 24 hours, and in dry gas. When the first and second heating steps were perform ed under the above-described conditions, the image defect was reduced by about 50%, and the level of deterioration in the color filter was reduced to ½ compared to the case where only the second heating step was performed.

Figure 5A:
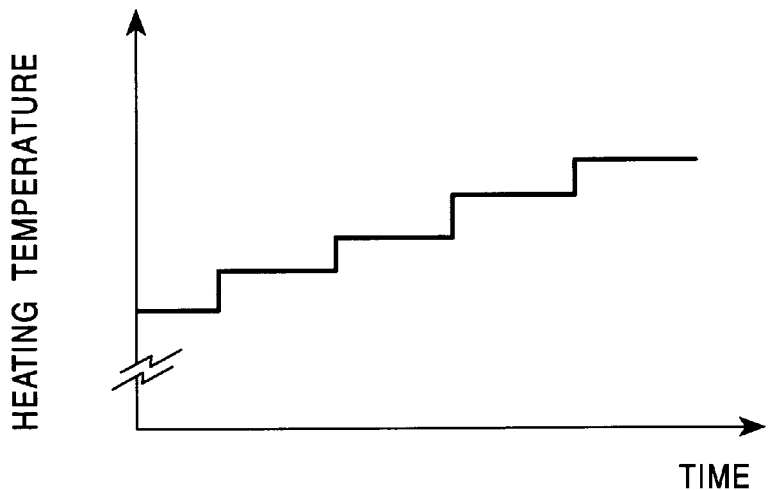
FIGS. 5A–5B is another profile showing the temperature during annealing.
Figure 5B:
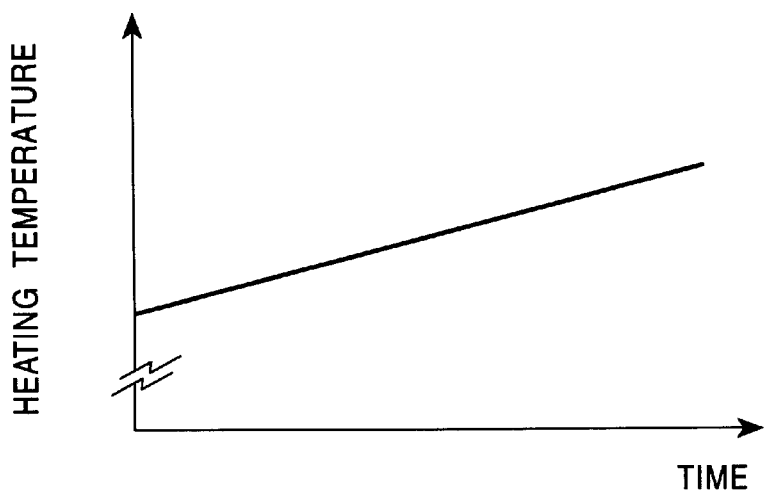

Although in the foregoing description, the heating temperature is kept at a certain level in the first heating step performed during annealing after assembly in order to reduce image defect level, the present invention is not limited thereto. More specifically, in the first heating step, as shown in FIG. 5A, the heating temperature of the solid-state imaging device can be changed in stages such that its graph changes stepwise, or as shown in FIG. 5B, the heating temperature can be changed such that its graph has a gradient which changes gradually.

As can be understood from the foregoing description, according to the method of post-processing the solid-state imaging device it accordance with the present invention, the solid-state imaging device is annealed at a predetermined temperature after assembly, whereby the image defect level which occurs after assembly can he effectively reduced.

In addition, the annealing comprises a first heating step in which the solid-state imaging device is heated, while preventing sudden vaporization of the moisture absorbed by the imaging device, and a second heating step in which the solid-state imaging device is heated at a higher temperature than in the first heating step, so that even in a highly hygroscopic solid-state imaging device, deterioration in a color filter due to synergistic actions between the heat and the moisture will not occur, thereby making it possible to effectively reduce the image defect level alone.

What is claimed is:

1. A method of post-processing a solid-state imaging device comprising annealing the solid-state imaging device, after assembly, wherein said annealing comprises a first heating step in which the solid-state imaging device is heated while preventing sudden vaporization of moisture absorbed by the solid-state imaging device, and a second heating step in which the solid-state imaging device is heated at a higher temperature than in said first heating step.

2. A method of post-processing a solid-state imaging device according to claim 1, wherein said first heating step is performed at a temperature of about 85° C. for 1 to 72 hours, while said second heating step is performed at a temperature of about 125° C. for about 24 hours.

3. A method of post-processing a solid-state imaging device according to claim 1, wherein said first heating step comprises changing the heating temperature in stages.

4. A method of post-processing a solid-state imaging device according to claim 1, wherein said heating step comprises gradually changing the heating temperature such that the temperature gradient is constant.

5. A method of post-processing a solid-state imaging device comprising annealing the solid-state imaging device after assembly in dry gas or under a reduced pressure, wherein said annealing comprises:

a first heating step in which the solid-state imaging device is heated while preventing sudden vaporization of moisture absorbed by the solid-state imaging device, and a second heating step in which the solid-state imaging device is heated at a higher temperature than in said first heating step.

6. A method of post-processing a solid-state imaging device according to claim 5, wherein said solid-state imaging device is a mold package tape solid-state imaging device.

7. A method of manufacturing a solid-state imaging device, comprising the steps of:

processing a wafer in order to form a plurality of solid-state imaging elements on the wafer;

dicing the wafer having formed thereon the plurality of solid-state imaging elements by said processing step in order to obtain solid-state imaging element chips;

assembling a solid-state imaging pickup device by electrically connecting the solid-state imaging element chips obtained by said dicing, and then packaging same; and annealing the assembled solid-state imaging device, wherein said annealing step comprises a first heating step in which the solid-state imaging device is heated while preventing sudden vaporization of moisture absorbed by the solid-state imaging device, and a second heating step in which the solid-state imaging device is heated at a higher temperature than in said first heating step.

8. A method of post-processing a solid-state imaging device according to claim 1, wherein said annealing is performed at a temperature ranging from 150° C. to 180° C.

9. A method of post-processing a solid-state imaging device according to claim 5, wherein said annealing is performed at a temperature ranging from 150° C. to 180° C.

10. A method of post-processing a solid-state imaging device according to claim 7, wherein said annealing is performed at a temperature ranging from 150° C. to 180° C.

* * * * *